United States Patent [19]

Huard

[11] Patent Number: 5,144,171
[45] Date of Patent: Sep. 1, 1992

[54] HIGH-SPEED DIFFERENTIAL-FEEDBACK CASCODE SENSE AMPLIFIER

[75] Inventor: Jeffrey M. Huard, Puyallup, Wash.

[73] Assignee: National Semiconductor Corporation, Santa Clara, Calif.

[21] Appl. No.: 613,411

[22] Filed: Nov. 15, 1990

[51] Int. Cl.$^5$ .......................... H03F 3/45; G11C 7/00
[52] U.S. Cl. ..................................... 307/530; 307/540
[58] Field of Search ............... 307/530, 540, 562, 567; 330/252, 258, 260, 310, 311, 253, 261

[56] References Cited

U.S. PATENT DOCUMENTS 4,785,259 11/1988 Seelbach et al. ............... 330/253 X

OTHER PUBLICATIONS

Horowitz et al. "A 3.5NS, 1 Watt, ECL Register File", 1990 IEEE International Solid-State Circuits Conference, Feb. 14, 1990.

Primary Examiner—Steven Mottola
Attorney, Agent, or Firm—Irving S. Rappaport; Robert C. Colwell; Richard L. Hughes

[57] ABSTRACT

A high-speed differential-feedback cascode sense amplifier includes an output stage and a voltage clamp. The voltage clamp is coupled to a pair of bit-sense lines of a memory system or other sense line source. The output stage is coupled to the output of the voltage clamp for generating an output signal having a logic state determined according to the current difference across the bit-sense lines. The voltage clamp includes a pair of transistors (e.g., cascode transistors) in cascode to a differential-feedback gain stage. Bit-sense lines are coupled to the cascode transistors and the differential-feedback gain stage. The gain stage amplifies the current difference across the bit-sense lines to define feedback voltage signals input to the cascode transistors. The parasitic voltage difference across the bit-sense lines resulting from driving the cascode transistors is small, approximately 3-7 mV for an ECL sense amplifier. Because the bit-sense lines are capacitively loaded very heavily, the small parasitic voltage difference across the bit-sense lines enables faster charging/discharging of the bit-sense lines for a memory access. The current difference acros the bit-sense lines is amplified by the gain stage to define feedback voltage signals having a relative voltage difference of approximately 45 milli-Volts. The output of the cascode transistors have a relative voltage difference of approximately 200-400 mV. The output stage further increases the voltage difference to produce two signals, one at each ECL logic state. One of the signal paths forms the sense amplifier output. The addressed memory contents determine whether the signal path for the output is at the logic high level or the logic low voltage level.

18 Claims, 3 Drawing Sheets

HIGH-SPEED DIFFERENTIAL-FEEDBACK CASCODE SENSE AMPLIFIER

BACKGROUND OF THE INVENTION

This invention relates to a bit-line sense amplifier. More particularly, this invention relates to a high-speed, differential-feedback, cascode-type sense amplifier for a memory system.

A conventional memory system is organized into columns of storage cells. Coupled to each storage cell in the column is a pair of bit-sense lines. When reading a storage cell, the logic state of the select cell determines the relative current difference of the bit-sense lines. One bit-sense line has a first current signal level, while the other bit-sense line has a second current signal level. A sense amplifier is connected to the pair of bit-sense lines for amplifying the current difference across the bit-sense lines to generate an output data signal representative of an appropriate logic state. For example, in a memory system having an ECL sense amplifier, the current difference across the bit-sense lines is amplified to generate output signals having specified ECL voltage levels. For a memory read of a cell storing a logic high, the corresponding current difference appearing across the bit-sense lines is amplified to generate output signals having an ECL logic high voltage level. Similarly, for a memory read of a cell storing a logic low, the corresponding current difference appearing across the bit-sense lines is amplified to generate an output signal having an ECL logic low voltage level.

Columns of memory have a very large capacitive load. To decrease the access time, the column capacitance and/or the parasitic voltage difference across the pair of bit-sense lines are reduced. Column capacitance is determined by the memory organization, topography and fabrication process. For large memories, the large column capacitances are unavoidable. Accordingly, to achieve a high speed sense amplifier it is desireable to provide minimal parasitic voltage difference across the bit-sense lines.

FIG. 1 shows a conventional sense amplifier 10, including resistors 12, 14 and differential amplifier 16. The bit sense line data signal $d_o$ and inverted data signal $d\_b_o$ are fed into the non-inverting and inverting terminals of the differential amplifier 16, respectively. Resistor 12 is coupled to the bit-sense line which carries the inverted data signal $d\_b_o$, while the resistor 14 is coupled to the bit-sense line which carries the data signal $d_o$. The differential amplifier 16 amplifies the difference of the input signals to generate the sense amplifier output signal $d_{out}$.

The resistors 12, 14 translate the currents of the respective bit-sense lines into voltage signals. Thus, the resistors 12, 14 determine the voltage difference between the two input signals $d_o$ and $d\_b_o$. For larger resistances, the memory access time is slow. Accordingly, lower resistances are desired for achieving faster access times. However, if low resistances are used to achieve a small voltage difference, the circuitry for the differential amplifier 16 becomes more complex. For a desirably small voltage difference, the complexity of the differential amplifier circuitry 16 results in an undesirably slow amplifier 16. For the complex amplifier 16 to amplify the voltage difference to the needed voltage level, the switching time becomes undesirably slow. As a result, the fast access time anticipated at the small voltage difference is offset by the decrease in speed of amplifier 16. Thus, a typical voltage difference across the bit-sense lines for an ECL amplifier 10 is approximately 300 mV. This results in an access time of approximately 12 nano-seconds. Accordingly, a smaller voltage difference is desired.

FIG. 2 shows another conventional sense amplifier—a cascode sense amplifier 20. The amplifier 20 includes the resistors 12, 14 and the differential amplifier 16 of FIG. 1, and also adds a pair of transistors 22, 24. The differential amplifier 16 is cascoded to the outputs of the transistors 22, 24. The bit-sense line which carries the data signal $d_o$ is coupled to the emitter of transistor 24, while the bit-sense line which carries the inverted data line $d\_b_o$ is coupled to the emitter of transistor 22. The respective bases of transistors 22, 24 are tied to a reference voltage $V_{ref}$. The reference voltage $V_{ref}$ biases the transistors 22, 24 enabling the respective data signals to flow to the differential amplifier 16 inputs. The transistors 22, 24 serve to amplify the data and inverted data signals $d_o$ and $d\_b_o$, respectively. A typical parasitic voltage difference across the bit-sense lines for an ECL cascode sense amplifier 20 is approximately 50 mV, resulting in an access time of approximately 2 nano-seconds.

A problem with amplifier 20 is an undesirable sensitivity to common mode noise. Noise generated on the power supply lines or the bit-sense lines may cause the transistors 22, 24 to shut off completely, resulting in glitches in the sense amplifier output signal $d_{out}$.

FIG. 3 shows yet another conventional sense amplifier 30, including a cross-coupled cascode clamp described in the publication "A 3.5 ns, 1 Watt, ECL Register File," by Horowitz et. al., 1990 IEEE International Solid-State Circuits Conference, presented Feb. 14, 1990. (IEEE publication no. 0193-6530/90/0000-0068). The amplifier 30 includes the differential amplifier 16 of FIG. 1, along with the cross-coupled cascode clamp 32 of Horowitz et. al. The clamp 32 includes resistors 12, 14 (comparable to those of FIGS. 1 and 2), resistors 34, 36, transistors 38, 40, 42, 44 and current sources 46, 48. The transistors 38, 40 perform similarly to the transistors 22, 24 of FIG. 2. The resistors 34, 36 and transistors 42, 44 are included for reducing the common mode noise problem of the amplifier 20 of FIG. 2. Resistors 34, 36 are coupled to a supply voltage. The transistors 42, 44 with resistors 34, 36 bias the base voltages of transistors 38, 40 so as to filter noise spikes. As a result, the bases of transistors 38, 40 are referenced to differential voltage levels which move so as to reduce the needed voltage difference across the bit-sense lines. A typical voltage difference across the bit-sense lines for the amplifier 30 is approximately 30 mV, resulting in an access time of approximately 1.2 nano-seconds.

Of the conventional sense amplifiers described, the sense amplifier 30 of FIG. 3 provides the lowest voltage difference and fastest access time, while reducing sensitivity to common mode noise. As the circuit for reducing the sensitivity to common mode noise limits the minimum voltage difference across the bit-sense lines (and thus limits the access time), there is a continuing need for reducing the voltage difference while maintaining a satisfactory common mode noise rejection level.

SUMMARY OF THE INVENTION

Bit-sense lines are capacitively loaded very heavily relative to the signal lines within a sense amplifier.

Thus, the time for charging or discharging the bit-sense lines is relatively large compared to the switching times of the sense amplifier components. Accordingly, the portion of the memory access time corresponding to the charging/discharging of the bit-sense lines is relatively large. By reducing the parasitic voltage difference across the bit-sense lines, the portion of the memory access time corresponding to the charging/discharging of bit-sense lines is reduced.

The parasitic voltage difference across the bit-sense lines occurs as a result of driving respective sense amplifier transistors with current signals of different levels. The current signals drive the respective transistors to different operating conditions causing a parasitic voltage difference.

According to the invention, a high-speed cascode sense amplifier is provided which provides a lesser relative parasitic voltage difference across a pair of bit-sense line, and thus, a faster memory access time. The sense amplifier includes an output stage and a cascode differential-feedback column voltage clamp. The pair of bit-sense lines are coupled to the column voltage clamp as input lines. The column voltage clamp amplifies the current difference across the bit-sense lines to generate a pair of voltage clamp output signals. Each voltage clamp output signal is coupled to the output stage which generates in response a sense amplifier data output signal.

According to one aspect of the invention, the column voltage clamp includes a differential-feedback gain stage. The bit-sense lines are coupled to this gain stage. The gain stage amplifies a parasitic voltage difference across the bit sense lines to generate a pair of feedback voltage signals input to a differential amplifier stage of the column voltage clamp. The differential-feedback gain stage enables a smaller relative parasitic voltage difference across the bit-sense lines by providing feedback signals to the differential amplifier stage. By operating with a smaller parasitic voltage difference, the time for charging and discharging the respective bit-sense lines decreases. Accordingly, the memory access time is fast. According to one embodiment, a voltage difference of approximately 5 milli-Volts (mV) occurs across the bit-sense lines of the sense amplifier inputs to generate an appropriate sense amplifier output signal.

According to another aspect of the invention, the differential amplifier stage of the column voltage clamp includes a pair of transistors (e.g., cascode transistors) in cascode to the output signals of the differential-feedback gain stage. The current difference across the gain stage outputs is amplified by the differential amplifier stage. The amplified signals are coupled to the output stage of the sense amplifier. According to one embodiment such coupling is achieved by a pair of level shifters.

According to another aspect of the invention, the differential-feedback gain stage includes a pair or resistors also coupled to the respective inputs of the differential amplifier stage. The resistors provide common mode noise reduction for the differential amplifier stage inputs by controlling differential reference voltages (e.g., feedback voltage signal levels).

DESCRIPTION OF THE PREFERRED EMBODIMENT

Overview

Figure 1:
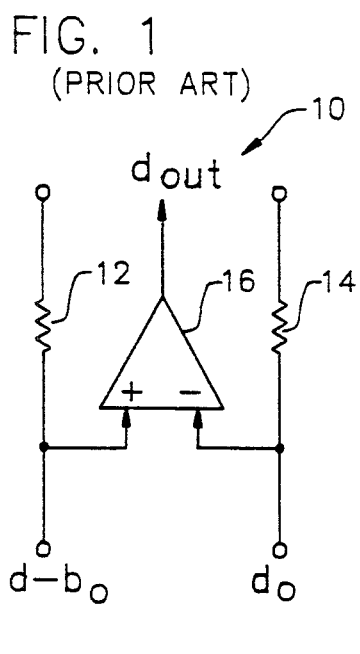
FIG. 1 is a schematic of a prior art sense amplifier.
Figure 2:
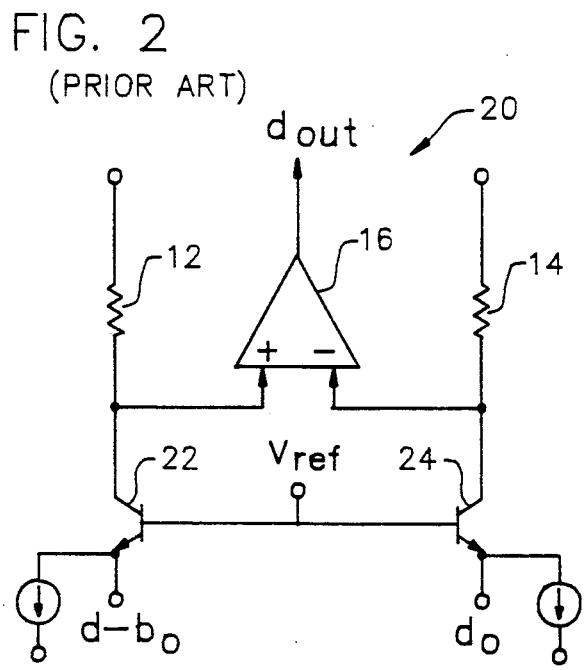
FIG. 2 is a schematic of a prior art cascode sense amplifier.
Figure 3:
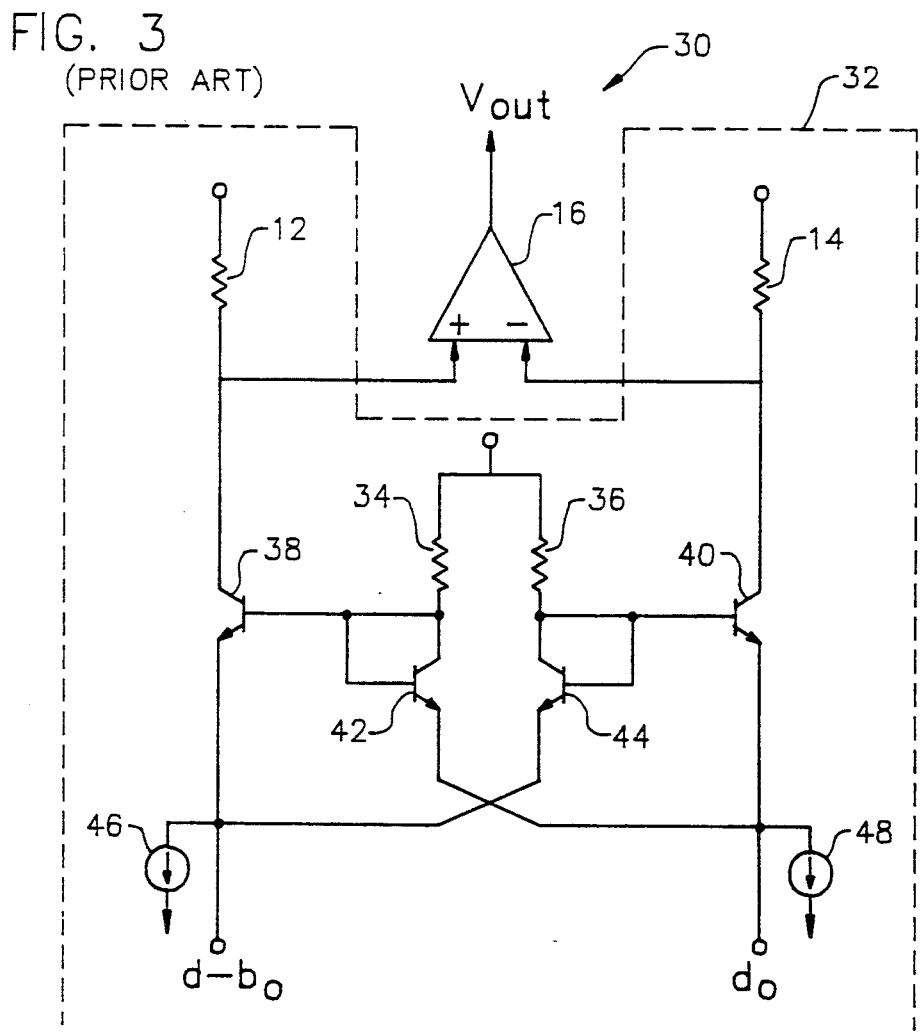
FIG. 3 is a schematic of a prior art cross-coupled cascode sense amplifier.
Figure 4:
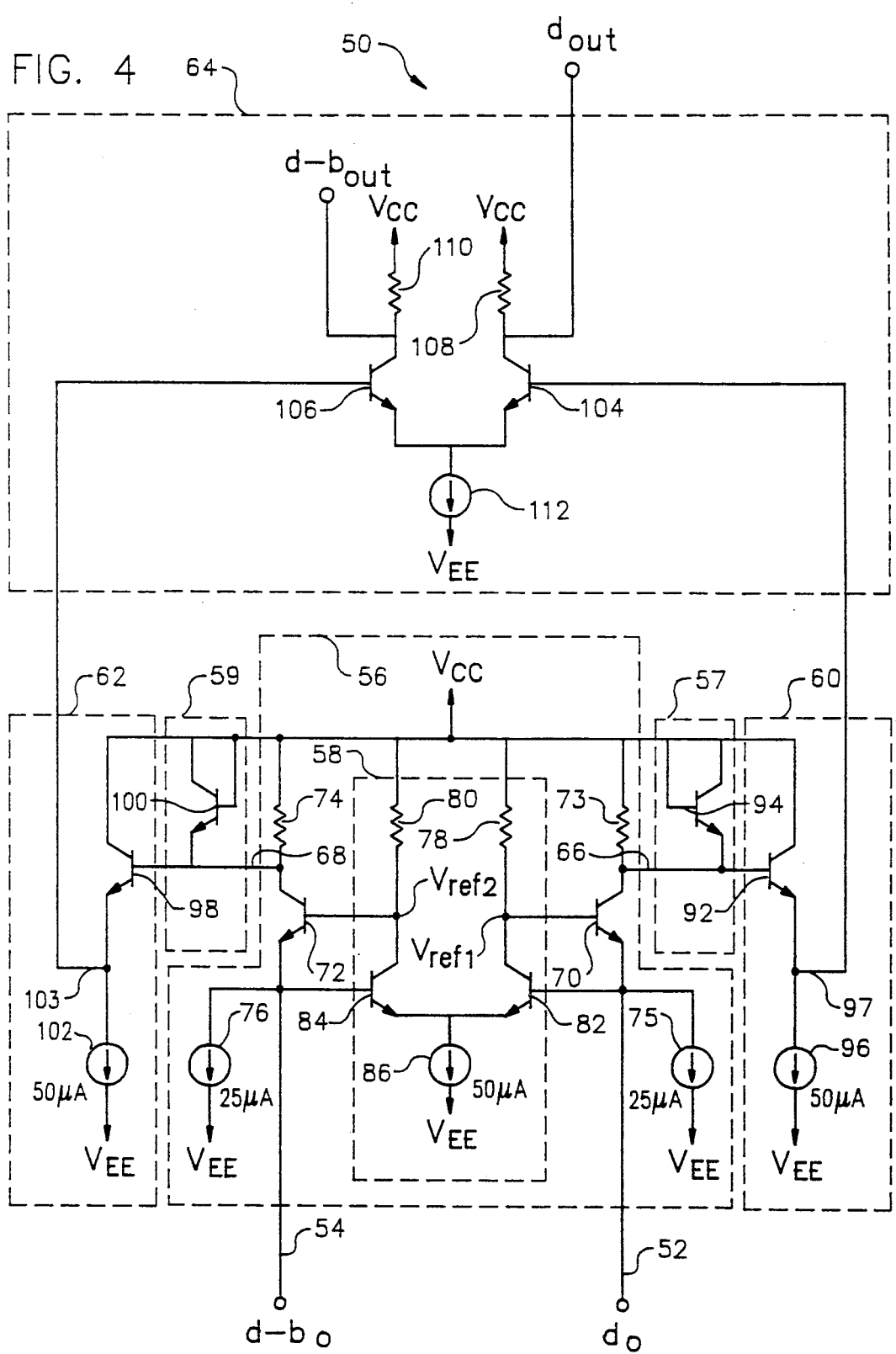
FIG. 4 is a schematic of a high-speed, differential-feedback cascode sense amplifier according to an embodiment of this invention.

FIG. 4 depicts a sense amplifier 50 according to an embodiment of this invention. The function of the sense amplifier 50 is to amplify the current difference across two bit-sense lines 52, 54 in a column of memory (not shown) to a data output voltage signal, $d_{out}$, and an inverted data output voltage signal, $d\_b_{out}$. The data output signal $d_{out}$ serves as the sense amplifier 50 output. The voltage level of the output signal $d_{out}$ defines either a logic high or logic low as determined by the current difference across the bit-sense lines 52, 54 (and thus, by an addressed memory cell's contents).

When a memory cell is read, the bit-sense lines are charged/discharged to form data signals $d_o$ and $d\_b_o$ each having a respective current level. The current difference between signals $d_o$ and $d\_b_o$ causes cascode transistors 70, 72 to be put into differing operating conditions, resulting in a parasitic voltage difference across the bit-sense lines at transistors 70, 72. To achieve a fast memory access time, it is desired that the parasitic voltage difference attributable to the current difference be small. A parasitic voltage difference of zero across the bit-sense lines 52, 54 at the transistors 70, 72 is ideal and desired.

According to an embodiment of this invention, the parasitic voltage difference across the bit-sense lines 52, 54 is approximately 3-7 milli-volts (mV). According to the conventional sense amplifiers 10, 20, 30 in the background section, the smallest voltage difference is described to be 30 mV. According to preferred embodiments of sense amplifier 50 according to this invention, a parasitic voltage difference of less than approximately 20 mV is achieved.

The current difference across the two bit-sense lines 52, 54 is amplified to generate voltage output signals for a logic high and a logic low. Depending on the polarity of the current difference (and thus the stored memory cell contents), the data output signal, $d_{out}$, corresponds to either the logic high or a logic low. The amplifier 50 amplifies the current difference across bit-sense lines 52, 54 to achieve an output signal $d_{out}$ having a voltage level which registers as a given logic state for a given technology. According to a preferred embodiment, the depicted sense amplifier 50 is an ECL sense amplifier used for a BiCMOS configurable RAM. Thus, for a logic high at output signal $d_{out}$ the voltage level is approximately $-0.8$ Volts, while for a logic low the voltage level is approximately $-1.5$ Volts.

The amplifier 50 includes a cascode column voltage clamp 56, internal voltage clamps 57, 59, level shifters 60, 62 and an output gain stage 64. The cascode clamp 56 receives the data signal $d_o$ and inverted data signal $d\_b_o$ of bit-sense lines 52, 54 as inputs and generates in response respective voltage clamp output signals 66, 68.

Internal voltage clamps 57, 59 limit the voltage difference across the clamp output signals 66, 68.

Each level shifter 60, 62 shifts the voltage level of the respective voltage clamp output signal 66, 68. The level-shifted signals are input to the output gain stage 64. The output gain stage 64 performs another differential amplification to generate ECL-specified logic levels at signals $d_{out}$ and $d\_b_{out}$. Signal $d_{out}$ serves as the sense amplifier output signal and indicates the logic level of the memory cell accessed.

The relative parasitic voltage difference between the bit-sense lines 52, 54 is approximately 3–20 mV, preferably 3–7 mV. The relative voltage difference between the voltage clamp 56 output signals 66, 68 is approximately 200–400 mV. The level shifters 60, 62 shift the respective clamp outputs by one diode drop. The output stage 64 then provides one more differential amplification to achieve signals, $d_{out}$ and $d\_b_{out}$.

Cascode Clamp with Differential-Feedback Gain Stage

The cascode column voltage clamp 56 is coupled to the bit-sense lines 52, 54 for receiving the data signal $d_o$ and the inverted data signal $d\_b_o$, respectively. The clamp 56 includes a differential-feedback gain stage 58 for amplifying the parasitic voltage difference across the bit-sense lines 52, 54 to generate respective feedback voltage signals coupled to the bases of transistors 70, 72, respectively. For bit-sense lines 52, 54 having a relative parasitic voltage difference of approximately 5 mV, the relative voltage difference across the feedback voltage signals is approximately 45 mV. According to other embodiments, the voltage difference across the feedback voltage signals may vary. Preferably, the relative voltage difference ranges between 25 and 75 mV. The transistors 70, 72 amplify this voltage difference to generate cascode clamp 56 output signals having a voltage difference of approximately 200–400 mV.

The cascode clamp 56 includes transistors 70, 72, resistors 73, 74, current sources 75, 76 and differential-feedback gain stage 58. The differential-feedback gain stage 58 includes resistors 78, 80, transistors 82, 84 and current source 86.

Cascode transistor 70 is coupled at its emitter to bit-sense line 52 and current source 75. Current source 75 keeps bit-sense line 52 from floating and keeps transistor 70 conducting. According to one embodiment, current source 75 is a 25 micro-Amp (uA) current source. Current source 75 enables transistor 70 to change conductance when switching between logic states faster than would result if transistor 70 were allowed to go into a non-conducting state.

Similarly, cascode transistor 72 is coupled at its emitter to bit-sense line 54 and current source 76. Current source 76 keeps bit-sense line 54 from floating and keeps transistor 72 conducting. According to one embodiment, current source 76 is a 25 micro-Amp (uA) current source. Current source 76 enables transistor 72 to change conductance when switching between logic states faster than would result if transistor 72 were allowed to go into a non-conducting state.

Cascode transistor 70 is coupled at its collector to internal voltage clamp 57 and level shifter 60, thereby providing one output signal 66 of the clamp 56. The transistor 70 collector also is coupled to resistor 73.

Similarly, cascode transistor 72 is coupled at its collector to internal voltage clamp 59 and level shifter 62, thereby providing the other output signal 68 of the clamp 56. The transistor 72 collector also is coupled to resistor 74.

Cascode transistor 70 is coupled at its base to the differential-feedback gain stage 58 at resistor 78 and the collector of transistor 82. Similarly, cascode transistor 72 is coupled at its base to the differential-feedback gain stage 58 at resistor 80 and the collector of transistor 84.

Resistors 78, 80 each are coupled to a supply voltage at one terminal and define respective reference voltages $V_{ref1}$ and $V_{ref2}$ at the other terminal. Such reference voltages are the voltage levels of the feedback voltage signals, respectively. The terminals at which the reference voltages are defines are coupled to the respective bases of transistors 70, 72. The resistors 78, 80 serve to adjust the voltage level at the bases of respective cascode transistors 70, 72 to differential reference voltage levels Vref1 and $V_{ref2}$ so as to compensate for common mode noise. Accordingly, resistors 78, 80 provide common mode noise reduction for the base inputs of transistors 70, 72.

The emitters of the gain stage transistors 82, 84 are coupled to current source 86. According to one embodiment, the current source 86 is a 50 uA current source (shown in block diagram format). The current source 86 provides the current to set up the reference voltages $V_{ref1}$ and $V_{ref2}$. The base of transistor 82 receives the data signal d from bit-sense line 52, while the base of transistor 84 receives the inverted data signal $d\_b_o$ from bit-sense line 54. Small changes in voltage at bases of transistors 82, 84 are amplified at the collectors and thus at the bases of respective cascode transistors 70, 72.

For a BiCMOS/ECL RAM, bit-sense lines 52, 54 carry data and inverted data signals of approximately 50 micro-Amps (uA). According to the configuration of cascode transistors 70, 72 and differential-feedback amplifier 58, the parasitic voltage difference across the bit-sense lines 52, 54 is approximately +/−3-7 milli-Volts (mV). The polarity of the current difference corresponds to the logic state of the memory cell being read. The differential-feedback gain stage 58 amplifies the approximately 3–7 mV parasitic voltage difference across the bit-sense lines 52, 54 to be approximately 45 mV between the respective bases of transistors 70, 72.

Internal Clamps 57, 59 and Level Shifters 60, 62

Level shifter 60 is formed by transistor 92 and current source 96. The transistor 92 receives at a base terminal the cascode clamp 56 output signal 66. Internal clamp 57 is formed by transistor 94 which is coupled at an emitter terminal to the output signal 66. Transistor 94 limits the voltage level of the output signal 66. The voltage change from transistor 92 base to emitter is equal to one diode voltage drop. Thus, transistor 92 shifts the voltage level of the output signal 66 by one diode voltage drop. The output of the level shifter 60 is taken at the emitter of transistor 92. Such emitter also is coupled to the current source 96 (shown in block diagram format). According to one embodiment, the current source 96 is a 50 uA current source which keeps the transistor 92 conductive, enabling a fast transition time. The level shifter 60 output signal is a first input to the output stage 64. Level shifting serves to apply an input signal to the output stage 64 which does not saturate the component transistor 104.

Similarly, level shifter 62 is formed by transistor 98 and current source 102. The transistor 98 receives at a base terminal the cascode clamp 56 output signal 68.

Internal clamp 59 is formed by transistor 100 which is coupled at an emitter terminal to the output signal 686. Transistor 100 limits the voltage level of the output signal 68. The voltage change from transistor 98 base to emitter is equal to one diode voltage drop. Thus, transistor 98 shifts the voltage level of the output signal 68 by one diode voltage drop. The output of the level shifter 62 is taken at the emitter of transistor 98. Such emitter also is coupled to the current source 102 (shown in block diagram format). According to one embodiment, the current source 102 is a 50 uA current source which keeps the transistor 98 conductive, enabling a fast transition time. The level shifter 62 output signal is a second input to the output stage 64. Level shifting serves to apply an input signal to the output stage 64 which does not saturate the component transistor 106.

Final Output Gain Stage 64

The output gain stage 64 as depicted in FIG. 4 receives the output signals from the respective level shifters 60, 62 and generates in response the data output signal $d_{out}$ and inverted data output signal $d\_b_{out}$. The data output signal $d_{out}$ corresponds to the logic state of the accessed memory cell as sensed from bit-sense lines 52, 54. The gain stage 64 includes a differential amplifier formed by transistors 104, 106, resistors 108, 110 and current source 112. The amplifier receives the level shifter output signals which have a voltage difference of approximately 200-400 mV and amplifies the signals differentially to generate a data output signal $d_{out}$ and an inverted data output signal $d\_b_{out}$. The data output signal, $d_{out}$, serves as the sense amplifier 50 output signal.

Performance

Figure 5:
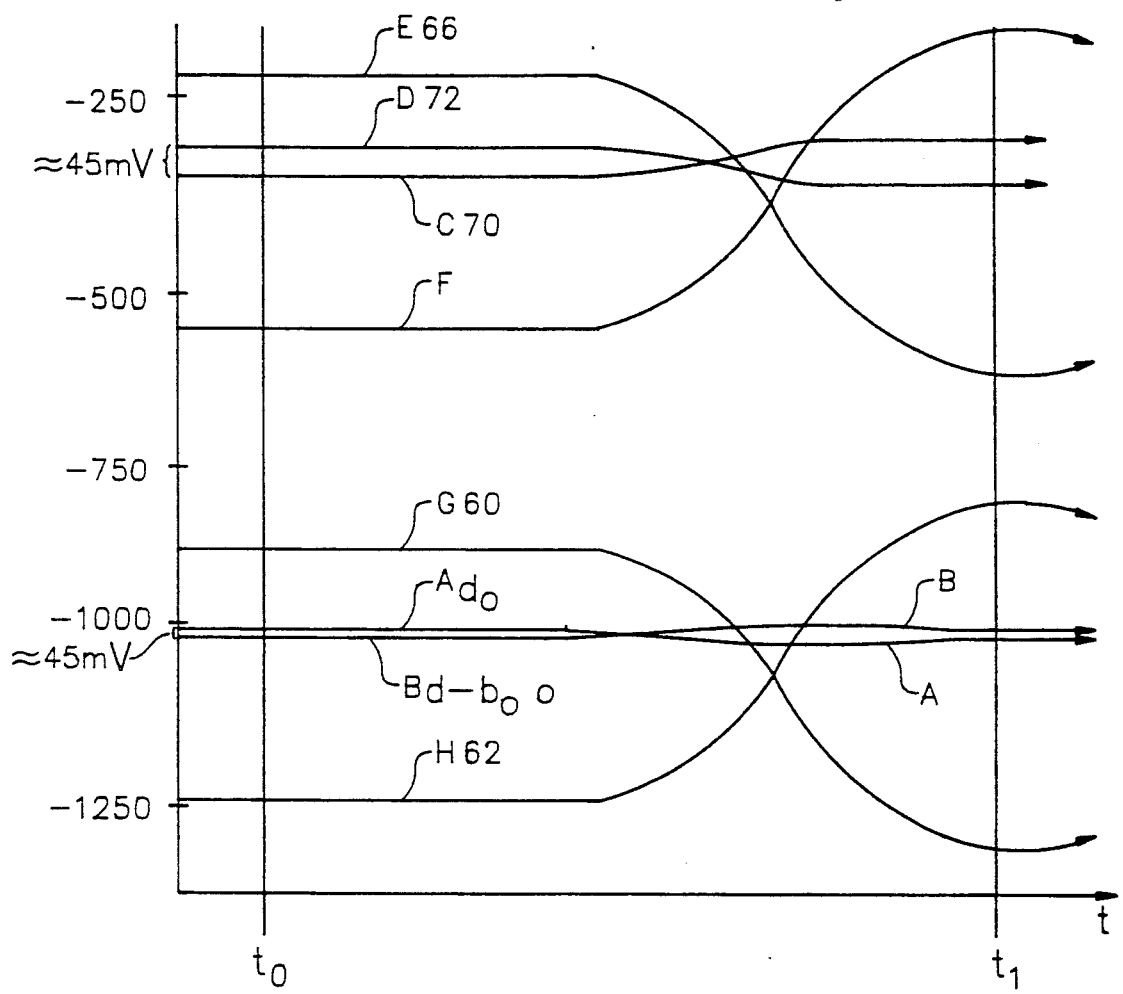
FIG. 5 is a graph of various voltage signals for the amplifier of FIG. 4.

Graphs of signals for the sense amplifier 50 according to a preferred embodiment of this invention are shown in FIG. 5. Curve A depicts the data signal $d_o$ of bit-sense line 52. Curve B depicts the inverted data signal $d\_b_o$ of bit-line sense line 54. At time $t_o$ the parasitic voltage difference between the two signals is approximately 5 mV. At time $t_1$ (after data transition) the parasitic voltage difference between the two signals is approximately $-5$ mV. As previously described the data signals are amplified by differential-feedback gain stage 58 to generate signals input to the respective bases of cascode transistors 70, 72. Curve C depicts the feedback voltage signal input to the base of transistor 70, while curve D depicts the feedback voltage signal input to the base of transistor 72. As shown the relative voltage difference at time $t_0$ is approximately 45 mV.

Curve E depicts the output signal 66 of the cascode clamp 56, while curve F depicts the output signal 68 of the cascode clamp 56. At time $t_0$ the voltage difference across the clamp outputs is approximately 300 mV, and may vary within a range of approximately 200-400 mV.

Curve G depicts the output signal from level shifter 60, while curve H depicts the output signal from level shifter 62. At time $t_0$ there is approximately a 400 mV voltage difference.

Figure 6:
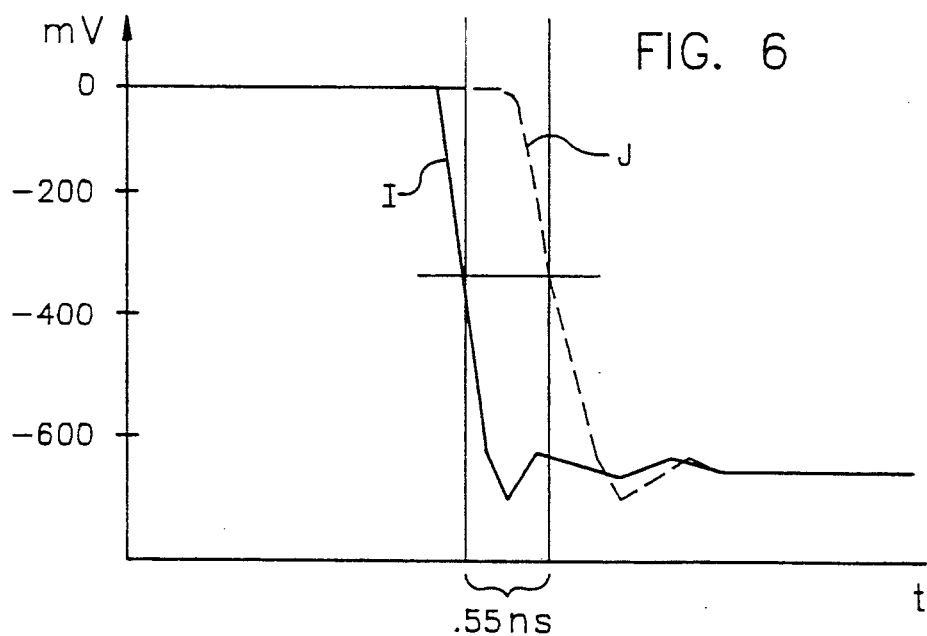
FIG. 6 is a graph of the sense amplifier output signals for the amplifier of FIG. 4 and the amplifier of FIG. 3.

FIG. 6 compares the output signal for the sense amplifier 50 according to an embodiment of this invention with an embodiment of the prior art sense amplifier 30. Curve I depicts the sense amplifier 50 output signal $d_{out}$. Curve J depicts the sense amplifier 30 output signal. As shown the switching time is approximately 0.55 ns faster for the sense amplifier 50 according to an embodiment of this invention. The prior art sense amplifier 30 suffers from a switching delay resulting from the cross-coupled cascode clamp configuration. Curve I also shows a smoother switching transition. Accordingly, the sense amplifier 5- according to an embodiment of this invention not only reduces the portion of memory access time attributable to the bit-sense line charging/discharging, but also reduces the portion attributable to the switching time of the sense amplifier components.

The memory access time for bit-sense lines 52, 54 having a 2 pico-farad load capacitance, a 50 uA current and approximately a 5 mV relative parasitic voltage difference is approximately 0.2 nano-seconds. The memory access time using the conventional sense amplifier 30 with a 30 mV relative parasitic voltage difference and the same load capacitance and sense line current is 1.2 nano-seconds.

Conclusion

Although a preferred embodiment of the invention has been illustrated and described, various alternatives, modifications and equivalents may be used. For example, the sense amplifier 50 components may be selected to achieve different gains at the various stages, and/or different speed/power trade-offs. Therefore, the foregoing description should not be taken as limiting the scope of the inventions which are defined by the appended claims.

What is claimed is:

1. A sense amplifier for amplifying the current difference across a pair of bit-sense lines to generate a data output signal, the sense amplifier comprising an output stage and a voltage clamp, the voltage clamp coupled to said pair of bit-sense lines and generating a pair of voltage clamp output signals, said pair of voltage clamp output signals coupled to said output stage, said output stage generating said data output signal, the voltage clamp comprising:

a differential-feedback gain stage coupled to said pair of bit-sense lines for amplifying the current difference across said bit-sense lines to generate a pair of feedback voltage signals wherein said differential-feedback gain stage comprises first and second transistor means, said first transistor means coupled at one terminal to a first of said pair of bit-sense lines and biased by a current signal to continuously maintain said first transistor means in a conducting state and to generate said first feedback voltage signal at a second terminal, said second transistor means coupled at one terminal to a second of said pair of bit-sense lines and biased by a current signal to continuously maintain said second transistor means in a conductive state and to generate said second feedback voltage signal at a second terminal; and an amplifier stage coupled to said differential-feedback gain stage, the differential amplifier stage receiving at one input a first of said pair of feedback voltage signals, the amplifier stage receiving at a second input a second of said pair of feedback voltage signals, said amplifier stage amplifying said first and second feedback voltage signals to generate said pair of voltage clamp output signals.

2. The sense amplifier of claim 1 in which said amplifier stage comprises:

third transistor means having a base terminal receiving said first feedback voltage signal and generating a first of said pair of voltage clamp output signals; and fourth transistor means having a base terminal receiving said second feedback voltage signal and generating a second of said pair of voltage clamp output signals.

3. The sense amplifier of claim 2 in which said differential-feedback gain stage further comprises:
first resistor means coupled to said second terminal of said first transistor means and to said base terminal of said third transistor means;
second resistor means coupled to said second terminal of said second transistor means and to said base terminal of said fourth transistor means;
said first and second resistor means for providing common mode noise rejection at said base terminals of said third and fourth transistor means.

4. The sense amplifier of claim 2 in which the relative parasitic voltage difference across said pair of bit-sense lines during a sense operation is less than 10 milli-Volts.

5. The sense amplifier of claim 4, in which a relative voltage difference between said first and second feedback voltage signals is less than 75 milli-Volts.

6. The sense amplifier of claim 2 in which the relative parasitic voltage difference across said pair of bit-sense lines during a sense operation is approximately 3–7 milli-Volts.

7. The sense amplifier of claim 6, in which a relative voltage difference across said first and second feedback voltage signals is approximately 45 milli-Volts.

8. The sense amplifier of claim 1 being an ECL sense amplifier for amplifying the current difference across a pair of bit-sense lines coupled to a column of memory, a relative parasitic voltage difference attributable to said current difference during a sense operation being less than approximately 20 milli-Volts.

9. A voltage clamp for a sense amplifier which amplifies the current difference across a pair of bit-sense lines to generate a data output signal, the voltage clamp coupled to said pair of bit-sense lines and generating a pair of voltage clamp output signals, said voltage clamp output signals coupled to an output stage of the sense amplifier for generating the data output signal, the voltage clamp comprising:
first and second transistor means, said first transistor means coupled to a first of said pair of bit-sense lines at an emitter terminal, said second transistor means coupled to a second of said pair of bit-sense lines at an emitter terminal;
means for biasing said first and second transistor means to continuously maintain said first and second transistor means in a conducting state;
means coupled to said pair of bit-sense lines for amplifying the current difference across said bit-sense lines to define a first and a second feedback voltage signal, said first feedback voltage signal coupled to said first transistor means at a base terminal, said second feedback voltage signal coupled to said second transistor means at a base terminal.

10. The voltage clamp of claim 9 in which said first and second transistor means form an amplifier for amplifying said first and second feedback voltage signals to generate said pair of voltage clamp output signals.

11. The voltage clamp of claim 9 in which said generating means comprises a differential-feedback gain stage coupled to said pair of bit-sense lines for amplifying the current difference across said bit-sense lines to generate said first and second feedback voltage signals.

12. The voltage clamp of claim 11 in which said differential-feedback gain stage comprises:

third transistor means coupled at one terminal to a first of said pair of bit-sense lines and biased by a current signal to generate said first feedback voltage signal at a second terminal;
fourth transistor means coupled at one terminal to a second of said pair of bit-sense lines and biased by a current signal to generate said second feedback voltage signal at a second terminal.

13. The voltage clamp of claim 12 further comprising:
first resistor means coupled to said second terminal of said third transistor means and to said base terminal of said first transistor means;
second resistor means coupled to said second terminal of said fourth transistor means and to said base terminal of said fourth transistor means;
said first and second resistor means for providing common mode noise rejection to said base terminals of said first and second transistor means.

14. The voltage clamp of claim 9 in which a relative parasitic voltage difference across said pair of bit-sense lines is less than 20 milli-Volts, in which said first and second transistor means are driven into conductance by said first and second feedback voltage signals respectively, said first and second feedback voltage signals having a relative voltage difference of approximately 25–75 milli-Volts.

15. A sense amplifier for amplifying the current difference across a pair of bit-sense lines to generate a data output signal, the sense amplifier comprising an output stage and a voltage clamp, the voltage clamp coupled to said pair of bit-sense lines and generating a pair of voltage clamp output signals, said pair of voltage clamp output signals coupled to said output stage, said output stage generating said data output signal, the voltage clamp comprising:
first transistor means having an emitter terminal coupled to a first of said pair of bit-sense lines, having a collector terminal at which a first of said voltage clamp output signals is defined, and having a base terminal which receives a first feedback current signal and having biasing means to continuously maintain said first transistor means in a conducting state;
second transistor means having an emitter terminal coupled to a second of said pair of bit-sense lines, having a collector terminal at which a second of said voltage clamp output signals is defined, and having a base terminal which receives a second feedback current signal and having biasing means to continuously maintain said second transistor means in a conducting state;
means coupled to said pair of bit-sense lines for controlling said first and second feedback current signal based upon the current difference across said pair of bit-sense lines;
means for defining a first and a second feedback voltage level having a relative voltage difference larger than a relative parasitic voltage difference across said pair of bit sense lines, wherein the base terminal of said first transistor means is at said first feedback voltage level and the base terminal of said second transistor means is at said second feedback voltage level.

16. The sense amplifier of claim 15 in which said controlling means and defining means form a differential-feedback gain stage and said first and second transistor means form a differential amplifier stage.

17. A method for sensing the current difference across a pair of bit-sense lines with a sense amplifier to generate a data output signal, the sense amplifier producing a parasitic voltage difference of less than 20 mV across said pair of bit-sense lines attributable to such current difference, the method comprising the steps of:

amplifying the current difference across said pair of bit-sense lines with a differential-feedback gain stage of said sense amplifier to generate a pair of feedback voltage signals, said pair of feedback voltage signals coupled to an amplifier stage of said sense amplifier, said differential feedback gain stage including first and second transistors coupled to said bit-sense lines;

continuously maintaining said first and second transistors in a conducting state;

amplifying each one of said pair of feedback voltage signals to generate a pair of voltage output signals, said amplifier stage coupled to said differential-feedback gain stage, said bit-sense lines coupled to said differential-feedback gain stage and to said amplifier stage so that a parasitic voltage difference across said bit-sense lines is less than 20 mV; and generating said data output signal in response to at least one of said pair of voltage output signals.

18. The method of claim 17 in which said parasitic voltage difference is less than 10 mV.

* * * * *